(12) United States Patent
Von Der Waydbrink et al.

(10) Patent No.: US 9,452,456 B2
(45) Date of Patent: Sep. 27, 2016

(54) CONTINUOUS SUBSTRATE TREATMENT PLANT AND CLEANING METHOD

(71) Applicant: VON ARDENNE Anlagentechnik GmbH, Dresden (DE)

(72) Inventors: Hubertus Von Der Waydbrink, Dresden (DE); Steffen Grosser, Dresden (DE); Michael Hentschel, Dresden (DE); Daniel Stange, Dresden (DE); Thomas Meyer, Dresden (DE)

(73) Assignee: VON ARDENNE GMBH, Dresden (DE)

( * ) Notice: Subject to any disclaimer, the term of this patent is extended or adjusted under 35 U.S.C. 154(b) by 410 days.

(21) Appl. No.: 14/027,701

(22) Filed: Sep. 16, 2013

(65) Prior Publication Data

US 2014/0076362 A1   Mar. 20, 2014

(30) Foreign Application Priority Data

Sep. 14, 2012  (DE) .......................... 10 2012 018 174
Aug. 5, 2013   (DE) .......................... 10 2013 108 405

(51) Int. Cl.
  *B08B 7/00*   (2006.01)
  *B65G 45/10*  (2006.01)
  *C23C 14/56*  (2006.01)

(52) U.S. Cl.
  CPC ............ *B08B 7/0071* (2013.01); *B65G 45/10* (2013.01); *C23C 14/56* (2013.01); *C23C 14/564* (2013.01)

(58) Field of Classification Search
  None
  See application file for complete search history.

(56) References Cited

U.S. PATENT DOCUMENTS

| | | | | |
|---|---|---|---|---|
| 5,138,693 A | * | 8/1992 | Knauss | A47J 27/024 134/107 |
| 2007/0237894 A1 | | 10/2007 | Powell | |
| 2008/0095938 A1 | * | 4/2008 | Basol | C23C 14/562 427/255.26 |
| 2009/0050057 A1 | * | 2/2009 | Von Der Waydbrink | C23C 16/54 118/718 |
| 2011/0056273 A1 | * | 3/2011 | Gorbunov | G01N 15/065 73/28.01 |
| 2011/0142746 A1 | * | 6/2011 | Reed | C23C 14/564 423/509 |

FOREIGN PATENT DOCUMENTS

| | | | |
|---|---|---|---|
| DE | 10 2008 039 430 A1 | 2/2009 | |
| DE | 10 2009 009 022 A1 | 8/2010 | |
| DE | 10 2009 049 954 A1 | 2/2011 | |
| DE | 102009049954 A1 * | 2/2011 | .......... C23C 14/541 |
| DE | 10 2013 206 598 | 10/2014 | |

OTHER PUBLICATIONS

English Machine Translation of DE 10 2009 049 954 A1.*

* cited by examiner

*Primary Examiner* — Nicole Blan
(74) *Attorney, Agent, or Firm* — Heslin Rothenberg Farley & Mesiti P.C.

(57) ABSTRACT

A substrate treatment plant includes a process chamber delimited by chamber walls and in the process chamber a substrate conveying unit for the horizontal conveyance of slab-shaped substrates in one conveying plane and in one conveying direction. The substrate conveying unit includes an arrangement of rotatably mounted, cylindrical conveying rollers transversely arranged to the conveying direction, the topmost generatrices of the conveying rollers defining the conveying plane, and at least one substrate treatment unit, which is located above the conveying plane, and at least one gas inlet. In the region of the substrate treatment unit at least one additional heating unit is located below the conveying plane and a condensation unit is located under the substrate conveying unit.

4 Claims, 3 Drawing Sheets

CONTINUOUS SUBSTRATE TREATMENT PLANT AND CLEANING METHOD

CROSS REFERENCE TO RELATED APPLICATIONS

Figure 1:
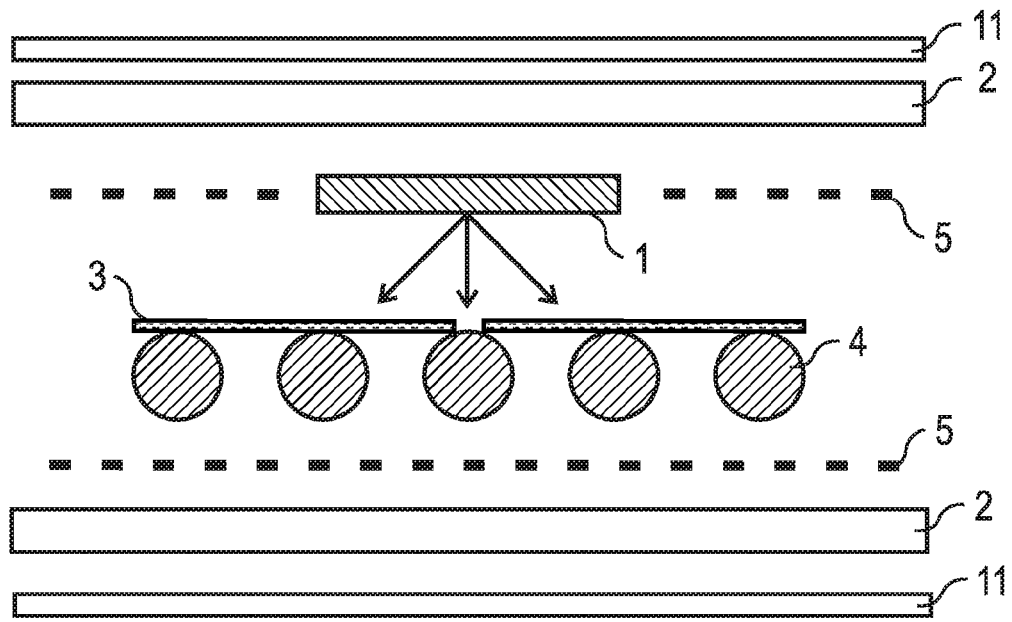

This application claims priority of German application 10 2012 018 174.4 filed on Sep. 14, 2012 and German application 10 2013 108 405.2 filed on Aug. 5, 2013, the entire contents of these applications being hereby incorporated by reference herein.

BACKGROUND ART

The invention relates to improvements to a horizontal continuous substrate treatment plant for the treatment, for example coating, of slab-shaped substrates, for example glass panels, wherein the substrates, with or without substrate mounts, lying on a conveying unit, i.e. in a horizontal orientation, are conveyed through a plant chamber delimited by chamber walls or an arrangement of a plurality of plant chambers arranged behind one another of a substrate treatment plant, wherein the substrates are subjected to the effect of at least one substrate treatment unit, such as, for example, coating units, etching units, etc. The substrate treatment, on the one hand, often takes place under a pressure which is lower than the atmospheric pressure (process vacuum), and, on the other hand, also oftentimes in a selected gas or gas mixture which is often introduced in a controlled manner (process atmosphere).

In contrast to what are referred to as batch substrate treatment plants, in continuous substrate treatment plants generally at least in each case a plant chamber, which is configured as a lock chamber, is located upstream and downstream of the plant chamber or an arrangement of a plurality of plant chambers arranged behind one another, which may be configured as, for example, process chambers, pump chambers, transfer chambers, etc., and a conveying unit is located inside the substrate treatment plant such that said conveying unit extends through the two lock chambers and through all other plant chambers located in between.

As a result, substrates can be moved in a conveying direction through the substrate treatment plant in that they are introduced into the substrate treatment plant by means of a first lock chamber, conveyed through the entire arrangement of plant chambers arranged behind one another by means of the conveying unit, and are evacuated from the substrate treatment plant by means of a second lock chamber. Here, the substrates in at least one process chamber are also moved past a substrate treatment unit located in said process chamber and thereby subjected to the required substrate treatment.

For the treatment of slab-shaped substrates, conveying units have proven successful which comprise a plurality of rotatably mounted, cylindrical conveying rollers transversely arranged to the conveying direction of the substrates, the topmost generatrices of said conveying rollers defining a horizontal conveying plane for the substrates, and at least some of said conveying rollers being drivable. In the event that the required substrate treatment takes place under elevated process temperatures, for example 400, 600 or 800° C., it has proven successful to manufacture the conveying rollers from heat-resistant materials, for example ceramics, or to coat them with a heat-resistant material.

For the coating of, for example, slab-shaped substrates, various vapor sources are known. The vapor source, or a vapor distributor connected to a vapor source, in a plant of the type described above may be arranged for example transversely to the conveying direction of the substrate such that an approx. 5 cm wide region of the substrate is impinged transversely across the width of the substrate by vapor.

The coating material may, for example, be carried to the location of vaporization in powder form by means of a carrier gas. The crucible of the vapor source which implements the melting and vaporization of the coating material may, for example, be formed by heated ceramic pipes. The crucible itself may, for example, have vapor outlet openings and thus simultaneously serve as vapor distributor. Alternatively, additional vapor distributors which are connected to the crucible or crucibles in a vapor-conducting manner may handle the task of directing the coating material from the vapor source towards the substrate. This leads to a distribution of the vapor in the entire coating region of the plant. A kind of mist is created which disseminates in the coating region of the plant, for example in what is referred to as a compartment.

An exemplary compartment may contain, for example, 12 conveying rollers, while the vapor source including suction pipes takes up the space of four conveying rollers. Suction pipes are located on both sides of the vapor source. Said suction pipes extract mainly the carrier gas from the compartment, but are unable to develop sufficient suction to have any effect on the mist.

One problem as a result of the mist is the unintentional coating of all components which are somewhat colder (e.g. below 600° C.), since the coating material condenses there (predominantly conveying rollers and chamber walls). The conveying rollers, which develop into what is referred to as "dog bones", become increasingly unsuitable through time for conveying a substrate. They, too, need to be cleaned or replaced.

In co-pending, unpublished German patent application DE 10 2013 206 598, assigned to the assignee of this patent application, known coating units and vacuum coating plants are improved with a view to preventing contamination and damage to layers produced on the surface of the substrate to be coated.

To this end, in a coating unit for a vacuum coating plant, which comprises a heatable vapor source for holding and vaporizing a coating material and at least one vapor outlet opening, the latter being configured such that it imparts a central vapor outlet direction to the evaporated coating material, it is proposed that the central vapor outlet direction is unequal to the gravitational direction. In order to prevent falling flakes of condensed coating material from hitting the substrate, it may be provided that a collection means for falling condensate is located below the at least one vapor outlet opening. This collection means, which is preferably configured as a pan arranged far from the outlet opening, for example immediately above the substrate, or as a conveying element which is transversely movable to the conveying direction, ensures that the flakes neither damage nor contaminate the layer of condensed coating material deposited on the substrate.

The present invention relates to a substrate treatment plant, as illustrated in FIG. 1, comprising a process chamber delimited by chamber walls 11 and in the process chamber a substrate conveying unit for the horizontal conveyance of slab-shaped substrates 3 in one conveying plane and in one conveying direction, wherein the substrate conveying unit comprises an arrangement of rotatably mounted, cylindrical conveying rollers 4 transversely arranged to the conveying direction, the topmost generatrices of said conveying rollers defining the conveying plane, and at least one substrate treatment unit 1, which is located above the conveying plane, and at least one gas inlet.

It is known that in the region of a substrate treatment unit 1 undesirable coatings are deposited on conveying rollers 4 in a process chamber delimited by process chamber walls, which process chamber for the generation of elevated process temperatures may have a heating device 5, wherein the process chamber walls are protected from the elevated process temperatures by means of a heat protective insulation 2, this deposition occurring as soon as the gap in the substrate is located below the substrate treatment unit and the conveying rollers are thus briefly exposed to a particle stream of the substrate treatment unit. The substrate treatment unit 1 may, for example, be configured as a magnetron for sputtering a material, or as a vapor source, or any other unit for depositing a material on a substrate. A process chamber having a substrate treatment unit with heating devices 5 in each case located above and below the conveying rollers 4, and thermal insulation 2, is illustrated at least section-wise in FIG. 1. By way of example, if a vaporization with carrier gas takes place, impulses of the vapor particles with the carrier gas occur, and the particles may in part also reach the conveying roller regions below the substrate, in particular the regions beside and under the edge of the substrate along the conveying direction. Even if the conveying rollers are configured as drums, the vapor particles reach in particular the ends of the drums, and a layered growth referred to as "dog bone" may form on the conveying rollers.

On account of the coatings of various thickness on the conveying rollers, conveying problems may occur, since the substrates no longer lie with their entire surface on the conveying rollers, as a result of which positive guiding of the substrates is no longer possible and deviations from the straight running of the substrates through the process chamber occur.

As a result of the diameter increase of the conveying rollers on account of the undesirable coating, higher circumferential speeds of the conveying rollers beneath the substrate treatment unit and thus an increase in the conveying speed and thus a variation in the layer thicknesses along the conveying direction of the substrates occur.

BRIEF DESCRIPTION OF THE INVENTION

It is an object of the invention to provide a cleaning device in the form of an ancillary heating unit and a condensation unit and also a cleaning method for the removal of layers in the form of undesirable coatings on the conveying rollers in a process chamber, in order for the conveying rollers not to have to be removed for cleaning.

The object is achieved in that in the region of the at least one substrate treatment unit at least one ancillary heating unit is located below the conveying plane and a condensation unit is located under the substrate conveying unit. In this manner, by heating the conveying rollers, the layers are to be evaporated or sublimed or molten and, if appropriate, drained off.

In order to keep cleaning as brief as possible, high temperatures are aimed for. Therefore, the components, such as conveying rollers, heat protective insulation and other fixtures, must be able to withstand the high temperatures.

The heating performance of the ancillary heating unit must be high enough to achieve sufficiently high temperatures.

An ancillary heating unit here is located between at least two conveying rollers such that a base surface, which extends parallel to the conveying plane, of the ancillary heating unit, measured in the conveying direction, has an extent which is larger than the clear distance between the two conveying rollers. The clear distance here is the shortest distance between two neighboring conveying rollers.

The base surface of the ancillary heating unit here may be formed by a panel located on the ancillary heating unit. The ancillary heating unit may be configured as a quartz-glass pipe heater, wherein a suitable choice of material has to be made for the panel in order to be able to operate the ancillary heating unit at high temperatures. CFC, for example, is suitable for this purpose and can be used at very high temperatures, but other materials resistant to high temperatures may also be used.

In one embodiment of the invention, the at least one ancillary heating unit is located opposite the substrate treatment unit below the conveying plane on the side of the conveying rollers which faces away from the conveying plane.

In a further embodiment of the invention, the ancillary heating unit may also be configured in the form of a heating strip of CFC. Said ancillary heating unit can be structured or thinned out in a suitable manner where heating of the conveying rollers is intended, in order to create a heating segment having high resistance. The unprocessed regions of the CFC strip serve as current supply having low resistance.

For the protection of the electrical terminals of the ancillary heating unit, a heat protective insulation is configured parallel to at least one chamber wall, wherein the electrical connections of the ancillary heating unit are located between the heat protective insulation and the chamber wall, in a region which is colder in relation to the interior of the process chamber.

The substrate treatment plant further comprises a condensation unit which has a discharge duct, a condenser and a pump unit, in order to be able to discharge in a targeted manner the material which has been evaporated by the additional heating unit.

In terms of the method, the object is correspondingly achieved in that a gas flow of a carrier gas via the gas inlet in front of and behind the substrate treatment unit is configured such that a gas mixture of carrier gas and material of the undesirable coatings is conveyed into the discharge duct. The evaporated material of the undesirable layers which is carried along by the introduced carrier gas reaches the outside via the discharge duct, through the thermal insulation and the process chamber wall, and is brought to condensation outside of the process chamber in a condenser and is suctioned off by a pump.

The condenser is to be provided such that it is easily removable for the purpose of cleaning. The condenser unit is to be configured such that as high a proportion of vapor as possible is condensed and does not make its way into the pump line.

The cleaning method comprises the heating of the undesirably coated conveying rollers, the evaporation or sublimation or the melting of the layers on the coated conveying rollers, the introduction of a carrier gas through a gas inlet, the removal of the gas mixture of carrier gas and evaporated material, the condensing of the evacuated gas by a condenser, and the pumping-off of the condensate by means of a pump.

This cleaning method is applicable to hot and cold plants.

BRIEF DESCRIPTION OF THE DRAWING FIGURES

The invention is to be explained in more detail below by means of a few exemplary embodiments.

Figure 2:
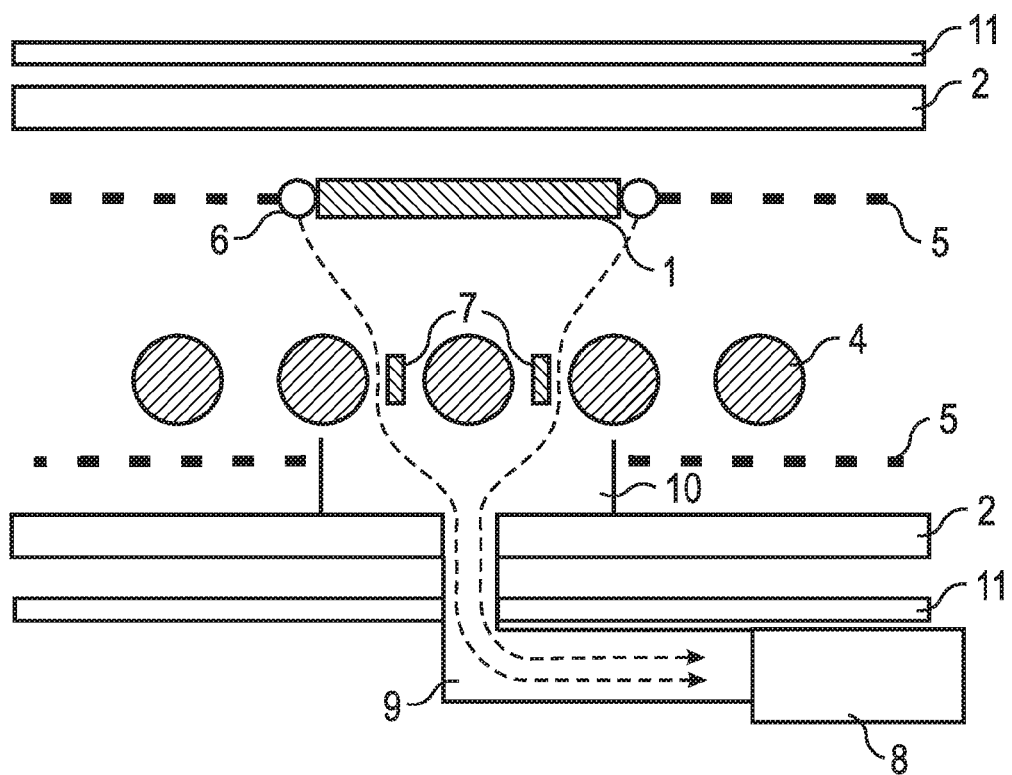
Figure 3:
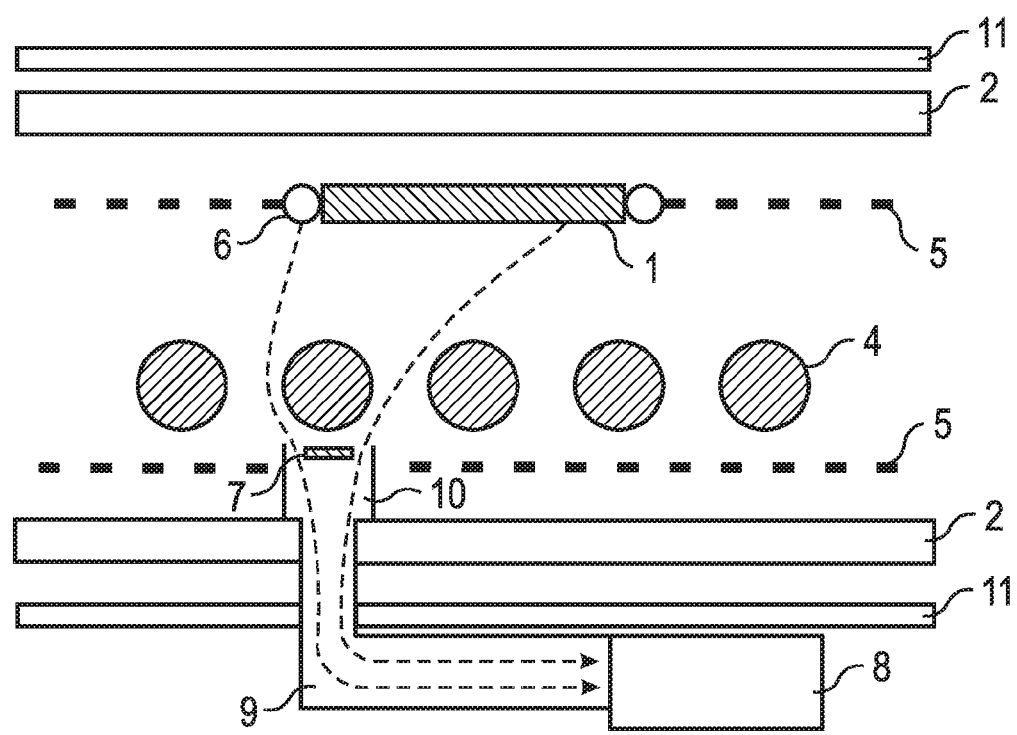
Figure 4:
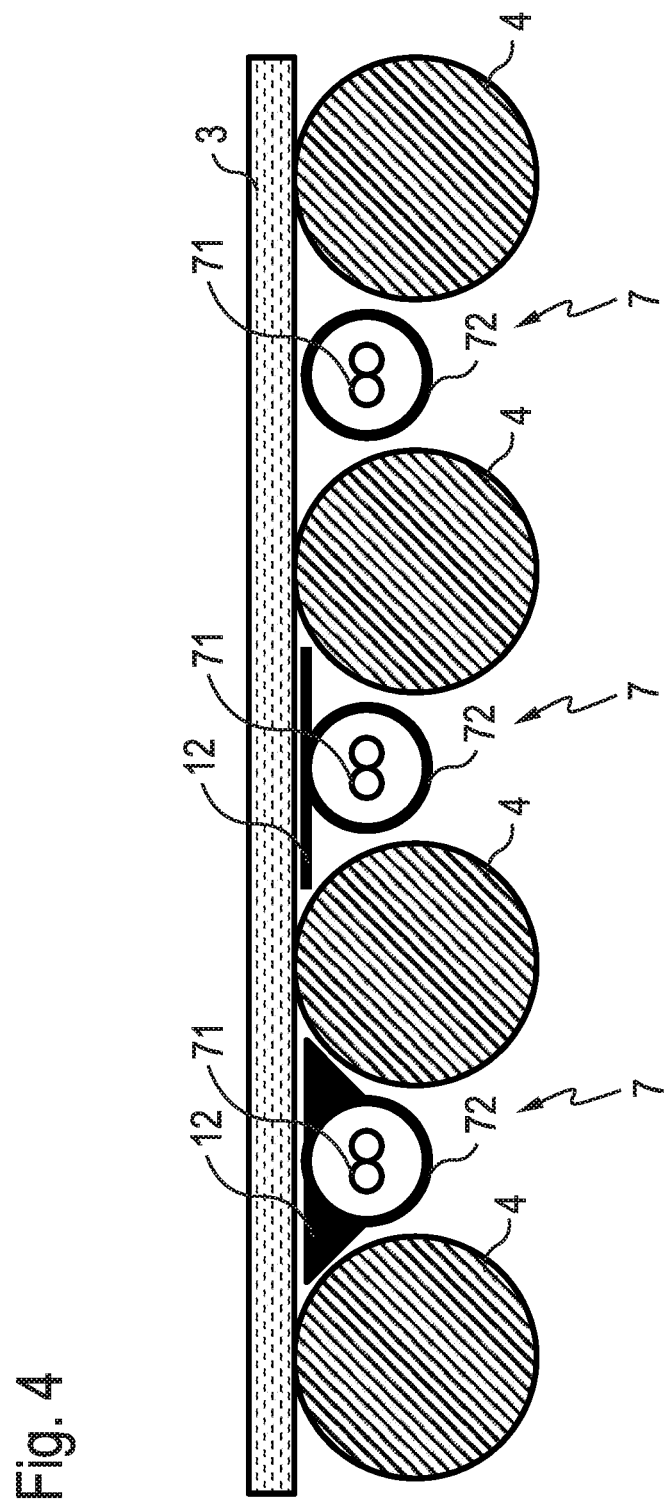

In the associated drawings:

FIG. 1 shows the process chamber with heating units in each case located above and below the conveying rollers, and thermal insulations, FIG. 2 shows the position of the ancillary heating unit in an exemplary embodiment of the invention between the conveying rollers, FIG. 3 shows the position of the ancillary heating unit in an exemplary embodiment of the invention below the conveying rollers, FIG. 4 shows configurations of the ancillary heating unit between the conveying rollers and below the substrate conveying plane.

DETAILED DESCRIPTION

In a first exemplary embodiment, an ancillary heating unit 7 is located between neighboring conveying rollers 4 in the region of the substrate treatment unit 1 (FIG. 2). The conveying rollers 4 are heated and the introduced carrier gas together with the evaporated material is conveyed out of the process chamber via a discharge duct 10 of a condensation unit. The condensation unit further includes a condenser 9 and a pump 8. The evaporated material is carried along by the flow of carrier gas from gas inlet 6. For the conveying rollers 4 to be cleaned, in each case one ancillary heating unit 7 and one discharge duct 10 are to be provided.

FIG. 3 shows a further configuration of the invention. The respective conveying rollers 4 are heated from below and the introduced carrier gas together with the evaporated material is conveyed out of the process chamber via a discharge duct 10. The evaporated material is carried along by the flow of carrier gas. For the conveying rollers 4 to be cleaned, in each case one ancillary heating unit 7 and one discharge duct 10 are to be provided.

FIG. 4 shows further embodiments of the ancillary heating unit 7. Heating rods of an ancillary heating unit 7 are located in each case between two neighboring conveying rollers 4 of a conveying unit for slab-shaped substrates 3, on the one hand to uniformly heat the substrate 3, on the other hand to evaporate again undesirable layers from the conveying rollers 4. The heating rods 7 here comprise quartz pipe heaters 71, wherein the heating element is formed from a tungsten filament which is embedded in a quartz pipe 72. The heating rod 7 illustrated on the extreme right represents a simple embodiment in which a double quartz pipe heater 71 having a cross section in the shape of an 8 is located in a protective pipe 72, such that the remaining space between conveying roller 4 and heating rod 7 is still rather large.

In contrast, the protective pipes 72 of the left and centre illustration in each case have laterally extending panels 12, which in the central illustration are executed in the form of a simple plate strip and in the left illustration are of a cuneiform cross section, and which serve for reducing the distance to neighboring conveying rollers 4. The panels 12 may also consist of a type of ceramics, for example SiC, or of CFC, since the panels 12 must withstand high temperatures, for example 700° C. to 800° C.

The invention claimed is:

1. A substrate treatment plant, comprising a process chamber delimited by chamber walls and having in the process chamber:

a substrate conveying unit for horizontal conveyance of slab-shaped substrates in a conveying plane and in a conveying direction, wherein the substrate conveying unit comprises an arrangement of rotatably mounted, cylindrical conveying rollers transversely arranged to the conveying direction, topmost generatrices of said conveying rollers defining the conveying plane, bottommost generatrices of said conveying rollers defining a lower plane, at least one substrate treatment unit located above the conveying plane, at least one gas inlet, and a cleaning device for removing an undesirable coating from a conveying roller of the substrate conveying unit while the conveying roller supports a substrate, the cleaning device being located in a region of the at least one substrate treatment unit, and including at least one ancillary heating unit located adjacent the conveying roller, below the conveying plane, and operative to remove the undesirable coating from the conveying roller while the conveying roller is supporting a substrate, and a discharge duct of a condensation unit located under the substrate conveying; unit, wherein the condensation unit further comprises a condenser, and a pump unit, both located outside of the process chamber, wherein the undesirable coating on the conveying roller of the substrate conveying unit is, in a targeted manner, evaporated or sublimed or melted by the at least one ancillary heating unit, discharged from the process chamber through the discharge duct, and condensed outside of the processing chamber in the condenser, wherein an ancillary heating unit of the at least one ancillary heating unit is located between at least one pair of adjacent conveying rollers, and between the conveying plane and the lower plane, such that a base surface, which extends parallel to the conveying plane, of the ancillary heating unit, measured in the conveying direction, has an extent which is larger than a clear distance between the at least one pair of adjacent conveying rollers, and wherein the base surface of the ancillary heating unit is formed by at least one panel extending laterally from a protective pipe of circular cross-section of the ancillary heating unit.

2. The substrate treatment plant as claimed in claim 1, wherein the at least one ancillary heating unit is located opposite the substrate treatment unit below the conveying plane on a side of the conveying rollers which faces away from the conveying plane, and within the discharge duct.

3. The substrate treatment plant as claimed in claim 1, wherein a heat protective insulation is configured parallel to at least one chamber wall, wherein electrical connections of the at least one ancillary heating unit are located between the heat protective insulation and the chamber wall.

4. The substrate treatment plant as claimed in claim 1, wherein the at least one gas inlet comprises a gas inlet in front of the substrate treatment unit and a gas inlet behind the substrate treatment unit for introducing and configuring a gas flow of a carrier gas past the conveying roller such that a gas mixture of carrier gas and material of the undesirable coating is conveyed into the discharge duct, wherein the gas mixture of a carrier gas and material of the undesirable coating is condensed in the condenser, and condensate is pumped off by the pump unit.

* * * * *

UNITED STATES PATENT AND TRADEMARK OFFICE
CERTIFICATE OF CORRECTION

PATENT NO.       : 9,452,456 B2
APPLICATION NO.  : 14/027701
DATED            : September 27, 2016
INVENTOR(S)      : Von Der Waydbrink et al.

Page 1 of 1

It is certified that error appears in the above-identified patent and that said Letters Patent is hereby corrected as shown below:

In the Claims

Column 6, Line 9: Claim 1, Delete "coaling" and insert -- coating --

Signed and Sealed this
Twentieth Day of December, 2016

Michelle K. Lee
*Director of the United States Patent and Trademark Office*